United States Patent
Peng et al.

(10) Patent No.: US 10,032,807 B2
(45) Date of Patent: Jul. 24, 2018

(54) ARRAY SUBSTRATE AND FABRICATION METHOD THEREOF, AND DISPLAY PANEL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xingyu Peng, Beijing (CN); Fuqiang Li, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/519,002

(22) PCT Filed: Sep. 9, 2016

(86) PCT No.: PCT/CN2016/098573
§ 371 (c)(1),
(2) Date: Apr. 13, 2017

(87) PCT Pub. No.: WO2017/121139
PCT Pub. Date: Jul. 20, 2017

(65) Prior Publication Data
US 2018/0102382 A1 Apr. 12, 2018

(30) Foreign Application Priority Data
Jan. 11, 2016 (CN) .......................... 2016 1 0016962

(51) Int. Cl.
*H01L 29/786* (2006.01)
*H01L 29/423* (2006.01)
(Continued)

(52) U.S. Cl.
CPC ........ *H01L 27/1248* (2013.01); *G02F 1/1368* (2013.01); *G02F 1/13439* (2013.01);
(Continued)

(58) Field of Classification Search
CPC ............. H01L 29/4908; G02F 1/13394; G02F 2001/1635; G02F 2001/133357
See application file for complete search history.

(56) References Cited

U.S. PATENT DOCUMENTS

2005/0280748 A1 12/2005 Ochiai et al.
2009/0039351 A1 2/2009 Kobayashi et al.
(Continued)

FOREIGN PATENT DOCUMENTS

CN 1420383 A 5/2003
CN 103378163 A 10/2013
(Continued)

OTHER PUBLICATIONS

International Search Report and Written Opinion dated Nov. 30, 2016; PCT/CN2016/098573.
(Continued)

*Primary Examiner* — Mohsen Ahmadi
(74) *Attorney, Agent, or Firm* — Ladas & Parry LLP

(57) ABSTRACT

An array substrate and a fabrication method thereof, and a display panel are provided. The array substrate includes: a base substrate; an isolation layer on the base substrate; and a first thin film transistor on the isolation layer and a first gate line extending in a gate line direction, wherein the first thin film transistor includes a first gate electrode and a first active layer, the isolation layer includes a protrusion portion which extends in the gate line direction and protrudes upwards with respect to the base substrate, and each of orthogonal projections of the first active layer and the first gate electrode of the first thin film transistor on the main (Continued)

surface of the base substrate is overlapped with an orthogonal projection of the first lateral surface of the protrusion portion on the main surface of the base substrate.

17 Claims, 9 Drawing Sheets

(51) Int. Cl.
    *G02F 1/1343*     (2006.01)
    *G02F 1/1333*     (2006.01)
    *G02F 1/1362*     (2006.01)
    *H01L 27/12*     (2006.01)
    *G02F 1/1368*     (2006.01)

(52) U.S. Cl.
    CPC .. *G02F 1/134309* (2013.01); *G02F 1/136209* (2013.01); *G02F 1/136227* (2013.01); *G02F 1/136286* (2013.01); *H01L 29/4238* (2013.01); *H01L 29/78675* (2013.01); *G02F 2001/13685* (2013.01); *G02F 2001/133357* (2013.01); *G02F 2201/121* (2013.01); *G02F 2201/123* (2013.01); *G02F 2201/50* (2013.01); *G02F 2202/104* (2013.01)

(56) References Cited

U.S. PATENT DOCUMENTS

| | | | |
|---|---|---|---|
| 2013/0270547 A1 | 10/2013 | Hsu et al. | |
| 2015/0212413 A1* | 7/2015 | Umeda | G03F 7/027 428/195.1 |
| 2015/0340389 A1* | 11/2015 | Liu | H01L 27/1255 257/71 |
| 2016/0020226 A1* | 1/2016 | Cheng | H01L 27/1218 257/72 |
| 2016/0172376 A1* | 6/2016 | Xu | H01L 27/124 349/46 |
| 2016/0343874 A1 | 11/2016 | Li | |
| 2017/0032167 A1* | 2/2017 | Chen | H01L 27/3227 |
| 2017/0199410 A1* | 7/2017 | Jiang | G02F 1/13394 |

FOREIGN PATENT DOCUMENTS

| | | |
|---|---|---|
| CN | 104439510 A | 3/2015 |
| CN | 104538454 A | 4/2015 |
| CN | 105226052 A | 1/2016 |
| CN | 105425493 A | 3/2016 |
| JP | 2011-118158 A | 6/2011 |
| TW | 201314333 A | 4/2013 |

OTHER PUBLICATIONS

The First Chinese Office Action dated Jan. 26, 2018; Appln. No. 201610016962.5.

* cited by examiner

ARRAY SUBSTRATE AND FABRICATION METHOD THEREOF, AND DISPLAY PANEL

TECHNICAL FIELD

Embodiments of the present disclosure relate to an array substrate and a fabrication method thereof, and a display panel.

BACKGROUND

An array substrate provided with structures, such as a thin film transistor (TFT) used as a pixel switch, a transparent pixel electrode for displaying, a gate line for controlling a gate electrode of TFT, a data line for controlling a source electrode of TFT and the like.

SUMMARY

An embodiments of the present disclosure provides an array substrate, comprising: a base substrate, with a main surface; an isolation layer on the main surface of the base substrate; and a first thin film transistor on the isolation layer and a first gate line extending in a gate line direction, wherein, the first thin film transistor includes a first gate electrode, a first active layer, a first source electrode and a first drain electrode, the isolation layer includes a protrusion portion which extends in the gate line direction and protrudes upwards with respect to the base substrate, the protrusion portion has a first lateral surface and a second lateral surface which extend along the gate line direction, the first lateral surface and the second lateral surface are arranged oppositely, and each of orthogonal projections of the first active layer and the first gate electrode of the first thin film transistor on the main surface of the base substrate is overlapped with an orthogonal projection of the first lateral surface of the protrusion portion on the main surface of the base substrate.

In an example, the protrusion portion further includes a bottom surface located between the first lateral surface and the second lateral surface and facing to the base substrate, the first lateral surface of the protrusion portion is a plane surface, and an included angle between the first lateral surface and the bottom surface is an acute angle.

In an example, the isolation layer further includes a main body layer located between the protrusion portion and the base substrate and having a uniform thickness.

In an example, the orthogonal projection of the first gate electrode of the first thin film transistor on the main surface of the base substrate is entirely within the orthogonal projection of the first lateral surface of the protrusion portion on the main surface of the base substrate.

In an example, the array substrate further comprises: an optical layer between the first thin film transistor and the isolation layer, wherein the orthogonal projections of the first gate electrode, the first active layer, the first source electrode and the first drain electrode of the first thin film transistor on the main surface of the base substrate and the orthogonal projection of the protrusion portion on the main surface of the base substrate are entirely positioned within an orthogonal projection of the optical layer on the main surface of the base substrate, and refractive indexes of the base substrate, the isolation layer and the optical layer are sequentially increased.

In an example, the array substrate further comprises: a second thin film transistor on the isolation layer and a second gate line extending in the gate line direction, wherein the second thin film transistor includes a second gate electrode, a second active layer, a second source electrode and a second drain electrode; and each of orthogonal projections of the second active layer and the second gate electrode of the second thin film transistor on the main surface of the base substrate is overlapped with an orthogonal projection of the second lateral surface of the protrusion portion on the main surface of the base substrate.

In an example, the second lateral surface of the protrusion portion is a plane surface and an included angle between the second lateral surface and the main surface of the base substrate is an acute angle.

In an example, the array substrate further comprises: an optical layer positioned between the first thin film transistor, the second thin film transistor and the isolation layer, wherein the orthogonal projections of the first gate electrode, the first active layer, the first source electrode and the first drain electrode of the first thin film transistor on the main surface of the base substrate, the orthogonal projections of the second gate electrode, the second active layer, the second source electrode and the second drain electrode of the second thin film transistor on the main surface of the base substrate, and the orthogonal projection of the protrusion portion on the main surface of the base substrate are entirely within an orthogonal projection of the optical layer on the main surface of the base substrate, and refractive indexes of the base substrate, the isolation layer and the optical layer are sequentially increased.

In an example, the optical layer is formed by a plurality of transparent material layers; and along a direction perpendicular to the main surface of the base substrate and away from the base substrate, refractive index of the respective transparent material layers are sequentially increased.

In an example, the protrusion portion further has a top surface arranged between the first lateral surface and the second lateral surface and away from the main body layer.

In an example, the array substrate further comprises: a gate insulating layer isolating the first active layer of the first thin film transistor from the first gate electrode of the first thin film transistor; and an inter layer dielectric layer isolating the first source electrode and the first drain electrode of the first thin film transistor from the first gate electrode, wherein, in a direction perpendicular to the base substrate, a portion of the first gate line, opposite to the first active layer is the first gate electrode of the first thin film transistor; the first active layer is a U-shaped low temperature poly silicon active layer; the orthogonal projection of the first active layer on the main surface of the base substrate includes a first portion overlapped with the orthogonal projection of the first lateral surface of the protrusion portion on the main surface of the base substrate, a second portion overlapped with a orthogonal projection of the top surface of the protrusion portion on the main surface of the base substrate, and a third portion outside the orthogonal projection of the protrusion portion on the main surface of the base substrate, wherein, each of two ends of the active layer positioned right above the top surface; the active layer is covered by the gate insulating layer, an orthogonal projection of the first gate line on the main surface of the base substrate is overlapped with the orthogonal projection of the first lateral surface of the protrusion portion on the main surface of the base substrate; the first gate line is covered by the inter layer dielectric layer; the first source electrode and the first drain electrode are connected with the two ends of the first active layer respectively through a first through hole and a second through hole which pass through the inter layer dielectric layer and the gate insulating layer.

In an example, the array substrate further comprises: a light blocking layer positioned between the base substrate and the isolation layer, wherein an orthogonal projection of a portion of the first active layer located above the first lateral surface on the main surface of the base substrate is entirely within an orthogonal projection of the light blocking layer on the main surface of the base substrate.

In an example, the isolation layer is formed by a silicon nitride material; and the array substrate further includes: a silicon oxide insulating layer below the first active layer and covering the isolation layer.

In an example, the protrusion portion has a top surface arranged between the first lateral surface and the second lateral surface and away from the main body layer; and the array substrate further includes: a light blocking layer on the optical layer, wherein an orthogonal projection of a portion of the first active layer located above the first lateral surface on the main surface of the base substrate is entirely within an orthogonal projection of the light blocking layer on the main surface of the base substrate; a buffer layer above the light blocking layer; a gate insulating layer isolating the first active layer of the first thin film transistor from the first gate electrode of the first thin film transistor; and an inter layer dielectric layer isolating the first source electrode and the first drain electrode of the first thin film transistor from the first gate electrode of the first thin film transistor, wherein, in a direction perpendicular to the base substrate, a portion of the first gate line opposite to the first active layer is the first gate electrode of the first thin film transistor; the first active layer is a U-shaped low temperature poly silicon active layer; the orthogonal projection of the first active layer on the main surface of the base substrate includes a first portion overlapped with the orthogonal projection of the first lateral surface of the protrusion portion on the main surface of the base substrate, a second portion overlapped with a orthogonal projection of the top surface of the protrusion portion on the main surface of the base substrate, and a third portion outside the orthogonal projection of the protrusion portion on the main surface of the base substrate, wherein each of two ends of the active layer is located right above the top surface; the active layer is covered by the gate insulating layer, an orthogonal projection of the first gate line on the main surface of the base substrate is overlapped with the orthogonal projection of the first lateral surface of the protrusion portion on the main surface of the base substrate; the first gate line is covered by the inter layer dielectric layer, the first source electrode and the first drain electrode are connected with the two ends of the first active layer respectively through a first through hole and a second through hole which pass through the inter layer dielectric layer and the gate insulating layer.

In an example, a refractive index of the buffer layer is smaller than that of the optical layer, and a portion of the buffer layer located right above the top surface of the protrusion portion includes a first hollow-out structure; and/or, a refractive index of the gate insulating layer is smaller than that of the optical layer, and a portion of the gate insulating layer located right above the top surface of the protrusion portion includes a second hollow-out structure; and/or, a refractive index of the inter layer dielectric layer is smaller than that of the optical layer, and a portion of the inter layer dielectric layer located right above the top surface of the protrusion portion includes a third hollow-out structure.

In an example, the refractive indexes of the buffer layer, the gate insulating layer and the inter layer dielectric layer are all smaller than that of the optical layer; and the first hollow-out structure of the buffer layer, the second hollow-out structure of the gate insulating layer and the third hollow-out structure of the inter layer dielectric layer are communicated with each other.

In an example, the array substrate comprises: a first pixel electrode connected with the first drain electrode of the first thin film transistor, the first pixel electrode being located right above the top surface of the protrusion portion.

In an example, the array substrate further comprises: a planarization layer covering the first thin film transistor; a common electrode located on the planarization layer and right above the top surface of the protrusion portion; a protective layer covering the common electrode and the planarization layer; and a first pixel electrode located on the protective layer and corresponding to the common electrode, wherein, the first pixel electrode is connected with the first drain electrode through a third through hole passing through the protective layer and the planarization layer.

In an example, a value of the included angle between the first lateral surface and the bottom surface of the protrusion portion is ranged from 10° to 80°.

In an example, materials constituting the isolation layer and the optical layer include at least one of materials: boron oxide, borax, silicon oxide, silicon nitride, aluminium oxide, zinc oxide, crystals, quartz, magnesium oxide, gallium oxide, tin oxide, cadmium oxide, indium oxide, bismuth oxide, nickel oxide, cadmium sulfide, calcium fluoride, copper oxide, ruby, sapphire, polypropylene, polyvinyl chloride, polystyrene, polytetrafluoroethylene and resin.

In an example, a value of a maximum thickness of the isolation layer is ranged from 30 nm to 90000 nm; and a value of a thickness of the optical layer is ranged from 30 nm to 90000 nm.

In an example, the value of the maximum thickness of the isolation layer is ranged from 30 nm to 90000 nm; and a value of a thickness of each of the transparent material layers is ranged from 30 nm to 90000 nm.

Another embodiments of the present disclosure provides a fabrication method of an array substrate, comprising: forming an isolation layer on a main surface of the base substrate, the isolation layer including: a protrusion portion which extends in a gate line direction and protrudes upwards with respect to the base substrate, wherein the protrusion portion has a first lateral surface and a second lateral surface which extend along the gate line direction, and the first lateral surface and the second lateral surface are arranged oppositely; and forming a first gate electrode and a first active layer of a first thin film transistor on at least one of two lateral surfaces of the protrusion portion, which extend along the gate line direction and are arranged oppositely, wherein each of orthogonal projections of the first active layer and the first gate electrode of the first thin film transistor on the main surface of the base substrate is overlapped with an orthogonal projection of the first lateral surface of the protrusion portion on the main surface of the base substrate.

Yet another embodiments of the present disclosure provides a display panel, comprising the above described array substrate.

BRIEF DESCRIPTION OF THE DRAWINGS

In order to clearly illustrate the technical solution of the embodiments of the disclosure or the prior art, the drawings of the embodiments or description in the prior art will be briefly described in the following. It is obvious that the described drawings are only related to some embodiments of the disclosure, and those skilled in the art also can obtain other drawings, without any inventive work, according to the drawings.

DETAILED DESCRIPTION

Figure 1:
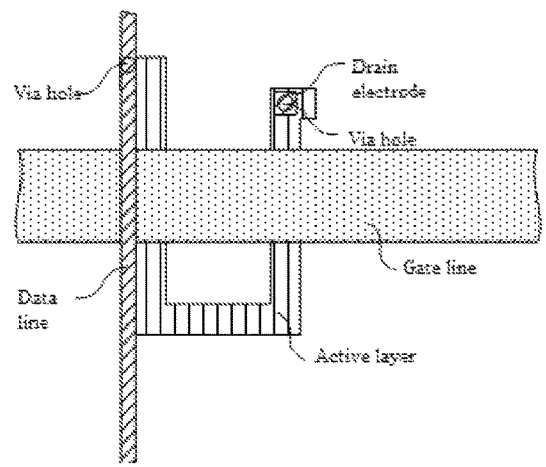
FIG. 1 is a top-view structural schematic diagram of a top-gate type LTPS TFT array substrate provided in a related art.

By taking a top-gate structural LTPS TFT array substrate (LTPS is the abbreviation of Low Temperature Poly Silicon, and LIPS TFT means that a semiconductor material adopted by an active layer in a TFT is the LIPS) in the related art as an example, as shown in FIG. 1, in a LIPS TFT structure, a pattern of the active layer generally is of a U shape, and a portion of a gate line, which is overlapped with the U-shaped pattern of the active layer, is a gate electrode in the TFT. A portion of a data line is used as a source electrode and is connected with one end of the U-shaped pattern of the active layer through a via hole in a gate insulating layer, and a drain electrode arranged on a same layer with the source electrode is connected with the other end of the U-shaped pattern of the active layer through another via hole in the gate insulating layer, so that a top-gate structural LTPS TFT is formed. Electrical performance of the TFT when the TFT is conducted is related to an area of a portion of the active layer, which corresponds to a position between the source electrode and the drain electrode, i.e., generally speaking, a channel when the TFT is conducted. Thus, in the LIPS TFT structure in the related art, the gate line needs to have a certain width, and the U-shaped pattern of the active layer also needs to have a certain U-shaped length, resulting in that the gate line and the TFT occupy a large area in the array substrate.

In addition, when the gate electrode in the TFT is directly connected with the gate line, due to limitation to a current manufacturing process, a width of the gate line is difficult to be fabricated to be small, resulting in a generally large non transmissive area occupied by the gate line and the TFT in the array substrate in the related art, thereby restricting further improvement of an aperture ratio of the array substrate.

Therefore, an embodiment of the present disclosure provides an array substrate and a fabrication method thereof, and a display panel, capable of reducing the non transmissive area occupied by a thin film transistor and a gate line in the array substrate and increasing the aperture ratio of the array substrate.

The technical solution of the embodiments will be described in a clearly and fully understandable way in connection with the drawings related to the embodiments of the disclosure. It is obvious that the described embodiments are just a part but not all of the embodiments of the disclosure. Based on the embodiments of the disclosure, those skilled in the art can obtain other embodiment(s), without any inventive work, which should be within the scope of protection of the disclosure.

It should be noted that all terms (including technical and scientific terms) used in the embodiments of the present disclosure are of the same meanings as understood by those skilled in the art of the present disclosure. It also should be understood that for example, those terms defined in general dictionaries should be understood to have consistent meanings with those in contexts in the related art, rather than being explained by idealized or extremely formalized meanings, unless definitely defined herein.

Each structure which the embodiments of the present disclosure relate to is very minute in size, and thus, for the sake of clarity, the size of each structure in the drawings of the embodiments of the present disclosure is amplified, and does not represent the actual size and scale.

Figure 2:
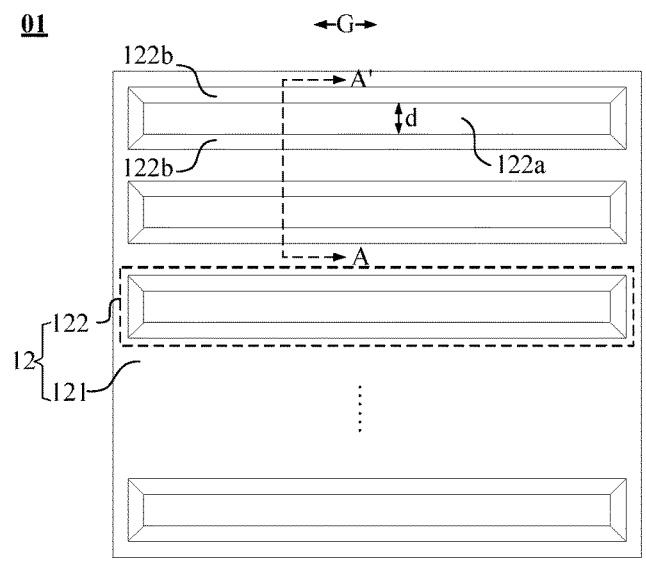
FIG. 2 is a top-view structural schematic diagram of an array substrate provided by an embodiment of the present disclosure.
Figure 3:
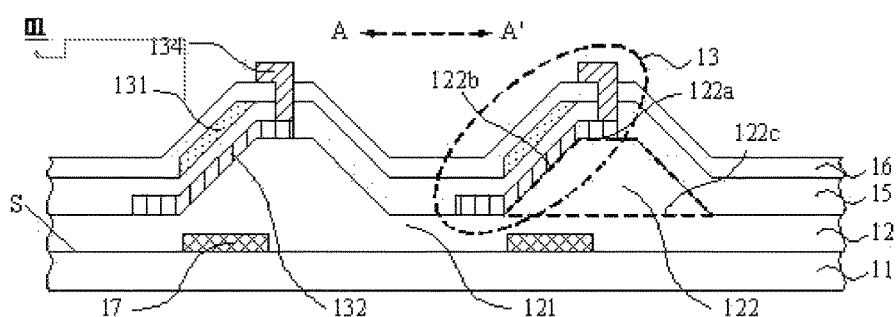
FIG. 3 is a sectional structural schematic diagram I of a portion A-A' in FIG. 2.
Figure 4:
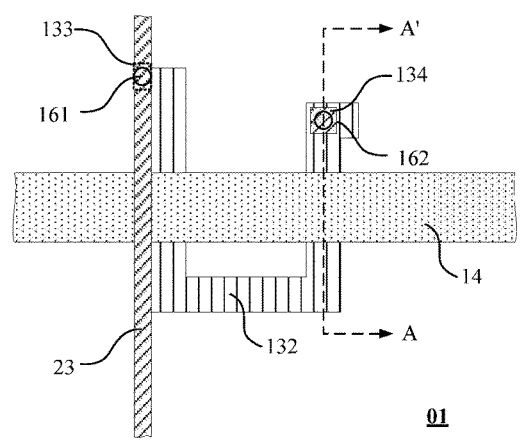
FIG. 4 is a corresponding top-view structural schematic diagram of the TFT with the sectional structural schematic diagram in FIG. 3.

As shown in FIG. 2 to FIG. 4, an embodiment of the present disclosure provides an array substrate 01. The array substrate 01 includes: a base substrate 11 (only shown in FIG. 3), and an isolation layer 12 positioned on the base substrate 11; the isolation layer 12 includes: a main body layer 121 in parallel to the base substrate 11, and a plurality of protrusion portions 122 positioned on the main body layer 121 and arranged in parallel to a gate line (in FIG. 1, the gate line is not shown, and only a direction of the gate line is expressed with a "G direction"); and the array substrate 01 further includes: a thin film transistor 13 (TFT in short, and the reference number 13 herein is only shown in FIG. 3) and the gate line 14 (the reference number 14 is only shown in FIG. 4), wherein the protrusion portion 122 includes two lateral surfaces 122b which extend along the gate line direction and are arranged oppositely; a row of TFTs 13 arranged along the gate line direction and one gate line 14 are arranged on at least one lateral surface 122b; the lateral surface 122b provided with the TFTs 13 and the gate line 14 is an inclined surface arranged upwards with respect to the main body layer 121. It can be understood that in another embodiment, the isolation layer 12 may not include the main body layer 121.

It should be noted that firstly, the case that the lateral surface 122b provided with the TFTs 13 and the gate line 14 is the inclined surface arranged upwards with respect to the main body layer 121 means that an inclination mode of the lateral surface 122b is an upwards inclination mode, and the inclined surface is away from the main body layer 121 and is not inclined toward the main body layer 121 downwardly.

Two lateral surfaces 122b of the protrusion portion 122, which extend along the gate line direction and are arranged oppositely, can be directly connected, i.e., a section of the protrusion portion 122 along a direction perpendicular to the gate line is of a triangular shape; or, the two lateral surfaces 122b also can be connected by a top surface which is arranged between two lateral surfaces 122b and away from the main body layer 121, i.e., the section of the protrusion portion 122 along the direction perpendicular to the gate line is of a trapezoid shape.

With reference to FIG. 2, the gate line 14 is arranged on the inclined surface, and the array substrate 01 includes a plurality of gate lines arranged in parallel, and thus, when the gate lines are arranged along a row direction, the plurality of protrusion portions 122 are arranged above the base substrate 11 in one column and in multiple rows.

Herein, when one row of TFTs 13 arranged along the gate line direction and one gate line 14 are provided on one lateral surface 122b of the protrusion portion 122 extending along the gate line direction, one protrusion portion 122 corresponds to one pixel period, i.e., one row of pixel units, in the array substrate 01; and when one row of TFTs 13 arranged along the gate line direction and one gate line 14 are provided on each of the two lateral surfaces 122b of the protrusion portion 122, which extend along the gate line direction and are arranged oppositely, one protrusion portion 122 corresponds to every two pixel periods, i.e., two adjacent rows of pixel units, in the array substrate 01.

Certainly, the array substrate 01, for example, further includes a data line connected with a source electrode of the TFT 13 (not shown in FIG. 2), and due to perpendicular intersecting arrangement of the data line and the gate line 14, when the gate line 14 is arranged on the inclined surface, the data line is arranged to cross the protrusion portions 122 along a length direction of the data line and bent upwards and downwards alternately.

Secondly, in order to better compare with the related art in FIG. 1, the TFT 13 provided by the embodiment of the present disclosure and arranged on the inclined surface also takes the top-gate structural LTPS TFT as the example, and a sectional structure and a top-view structure of the TFT 13 respectively refer to FIG. 3 and FIG. 4, wherein for the sake of simplicity, FIG. 3 and FIG. 4 only show two adjacent protrusion portions 122.

It can be seen from FIG. 3 and FIG. 4 that when the above described active layer and the gate line are respectively the same in graphic size with the active layer and the gate line in the plane TFT provided in the related art, due to arrangement of the TFT 13 on the inclined surface, projections of the active layer and the gate line with the same graphic sizes on a plane are smaller than those in the related art, so that occupation on the non transmissive area in the array substrate 01 is reduced. Inclination angles of the active layer and the gate electrode in the TFT 13 are the same, an overlapping area between the active layer and the gate electrode is the same with that in the plane TFT in the related art, and thus, the prepared TFT in the array substrate 01 provided by the embodiment of the present disclosure has the same channel performance with the plane TFT in the related art, but non transmissive is smaller than that in the array substrate 01.

Herein, it is considered that when an included angle between the lateral surface 122b on which the TFT 13 and the gate line 14 are arranged and a horizontal plane is excessively small, i.e., inclination is relatively small, compared to the related art in which the TFT 13 and the gate line 14 are arranged on the horizontal plane, the area of the non transmissive region occupied by the TFT 13 and the gate line 14 is reduced less; and when the included angle between the lateral surface 122b on which the TFT 13 and the gate line 14 are arranged and the horizontal plane is excessively large, i.e., the inclination is excessively large, the TFT 13 needs to be formed by carrying out a patterning process for many times and the process difficulty is relatively high. Thus, for example, a value of the included angle between the lateral surface 122b on which the TFT 13 and the gate line 14 are arranged and the horizontal plane is ranged from 10° to 80°. Herein, a plane where an upper surface of the base substrate 11 is located can be regarded as the horizontal plane.

Thirdly, the main body layer 121 and the protrusion portions 122, for example, are of an integral structure. A film layer with a certain thickness can be firstly deposited and then is processed by a patterning process to form the protrusion portions 122 with the inclined surfaces, and after processing by the patterning process, a portion which is relatively flat and is uniform in thickness is the main body layer 121, and the respective protrusion rows on the main body layer 121 are the respective protrusion portions 122.

Herein, when the main body layer 121 and the protrusion portions 122 are of the integral structure, a material constituting the isolation layer 12 can include, but are not limited to, at least one of boron oxide ($B_2O_3$), borax ($Na_2B_4O_7 \cdot 10H_2O$), silicon oxide ($SiO_2$), silicon nitride ($SiN_x$), aluminium oxide ($Al_2O_3$), zinc oxide (ZnO), crystals, quartz, magnesium oxide (MgO), gallium oxide ($Ga_2O_3$), tin oxide ($SnO_2$), cadmium oxide (CdO), bismuth oxide ($Bi_2O_3$), nickel oxide (NiO), cadmium sulfide (CdS), calcium fluoride ($CaF_2$), copper oxide (CuO), magnesium fluoride ($MaF_2$), ruby, sapphire, polypropylene, polyvinyl chloride, acrylonitrile butadiene styrene copolymer (ABS), polystyrene and polytetrafluoroethylene (also known as Teflon), i.e., the integral structure can be a single-layer or double-layer structure formed by the above material(s).

On this basis, by the array substrate provided by the embodiment of the present disclosure, the TFT 13 and the gate line are arranged on the inclined surface, and with reference to FIG. 4, when patterns with a same width are manufactured, a projection of the structure on the plane, which is arranged on the inclined surface, is smaller, and thus, compared to the related art in which the TFT and the gate line are formed on the horizontal plane, the TFT and the gate line formed on the inclined surface in the embodiment of the present disclosure occupy a smaller non transmissive area in the array substrate 01, so that the aperture ratio of the array substrate 01 is increased.

On this basis, an embodiment of the present disclosure further provides a fabrication method of the array substrate 01. The fabrication method includes:

Forming an isolation layer 12 on a base substrate 11, the formed isolation layer 12 including: a main body layer 121 in parallel to the base substrate 11, and a plurality of protrusion portions 122 arranged in parallel to a gate line.

Forming a row of TFTs 13 arranged along the gate line direction and a gate line 14 on at least one of two lateral surfaces 122b of the protrusion portion 122, the two lateral surfaces 122b extend along the gate line direction and are arranged oppositely, wherein the lateral surface 122b on which the TFTs 13 and the gate line 14 are formed is an inclined surface arranged upwards with respect to the main body layer 121.

Further, the present disclosure provides two embodiments with different TFT structures in order to illustrate the array substrate 01 in detail.

Embodiment 1

With reference to FIG. 3 and FIG. 4, the protrusion portion 122 has a top surface 122a which is arranged between the two opposite lateral surfaces and is away from a main body layer 121; the array substrate 01, for example, includes: a gate insulating layer 15 isolating an active layer 132 of a TFT 13 from a gate electrode 131 of the TFT 13, and an inter layer dielectric layer 16 isolating a source electrode 133 and a drain electrode 134 of the TFT 13 from the gate electrode 131, wherein a portion of the gate line 14, which corresponds to the active layer 132 (for example, in a direction perpendicular to the base substrate 11, a portion of a gate line 14, which is overlapped with the active layer), is the gate electrode 131 of the TFT 13; the active layer 132, for example, is a U-shaped LTPS active layer; the active layer 132 crosses the main body layer 121, the inclined surface (i.e., the lateral surface 122b on which the TFT 13 is arranged) and the top surface 122a, wherein each of two ends of the U shape of the active layer 132 are positioned on the top surface 122a; the gate insulating layer 15 covers the active layer 132, and the gate line 14 is positioned in a region of the gate insulating layer 15, which covers the inclined surface; the inter layer dielectric layer 16 covers the gate line 14; and the source electrode 133 and the drain electrode 134 are connected with the two ends of the U-shaped active layer 132 respectively through a first through hole 161 and a second through hole 162 which pass through the inter layer dielectric layer 16 and the gate insulating layer 15. Each of orthogonal projections of the active layer 132 and the gate electrode 131 of the TFT 13 on a main surface S of a base substrate 11 are overlapped with orthogonal projections of the corresponding lateral surface of the protrusion portion 122 on the main surface S of the base substrate 11.

It should be noted that firstly, at least one of the two lateral surfaces 122b of the protrusion portion 122 which extend along the gate line direction and are arranged oppositely, is an inclined surface arranged upwards with respect to the main body layer 121, and thus, the top surface 122a of the protrusion portion 122, which is away from the main body layer 121, for example, is smaller than a bottom surface closer to the main body layer 121, i.e., the protrusion portion 122 is of a trapezoidal platform structure.

FIG. 3 illustrates only by taking a case that one row of TFTs 13 arranged along the gate line direction and one gate line 14 are arranged on one lateral surface 122b of the protrusion portion 122 extending along the gate line direction, as the example, and Embodiment 1 is also applicable to a case that one row of TFTs 13 arranged along the gate line direction and one gate line 14 are arranged on each of two lateral surfaces 122b of the protrusion portion 122, which extend along the gate line direction and are arranged oppositely.

Secondly, the active layer 132 crosses the main body layer 121, the inclined surface and the top surface 122a, which means that the orthogonal projection of the U-shaped active layer 132 on the upper surface of the isolation layer 12 at least covers a portion of the main body layer 121 uncovered by the protrusion portion 122, at least a portion of the top surface 122a of the protrusion portion 122 and at least a portion of the lateral surface 122b. For example, the two ends of the U-shaped active layer 132 are positioned right above the top surface 122a of the protrusion portion 122, a bottom of the U-shaped active layer 132, which is away from the two ends of the U shape, is positioned right above the portion of the main body layer 121 uncovered by the protrusion portion 122, and the other portion of the active layer pattern 132, i.e., the portion corresponding to the gate electrode 131, is positioned above the inclined surface of the protrusion portion 122.

Herein, the TFT in the array substrate 01 provided by Embodiment 1 is the top-gate structural LTPS TFT. By utilizing top gate of a self-aligned structure, the top gate structure has an advantage that a length of the channel can be accurately controlled, and narrow channel design becomes possible, so that performance of a LTPS TFT device and display image quality of a liquid crystal display (LCD) are greatly promoted. In addition, in the top-gate structural LTPS TFT, the source electrode and the drain electrode are in contact with the active layer through via holes in the insulating layer, and thus, compared with a structure of a bottom-gate structural LTPS TFT, in which a source electrode and a drain electrode are directly deposited on an active layer, the top-gate structural LTPS TFT can avoid influence on performance of an LTPS material of the active layer by a high temperature in the process of depositing the source electrode and the drain electrode.

With reference to FIG. 4, in order to further reduce the non transmissive area occupied by the data line 23, a portion of the data line 23 corresponding to one end of the U-shaped active layer 132 (for example, in the direction perpendicular to the base substrate 11, a portion of the data line 23, which is overlapped with the one end of the U-shaped active layer 132), is the source electrode of the TFT 13.

Further, the gate electrode 131 of the top-gate structural LTPS TFT is positioned above the active layer 132, which is away from the base substrate, and thus, in order to avoid a case that after the array substrate 01 is applied to a display apparatus, light in a backlight is irradiated to a channel region of the active layer to generate a photogenic current to influence performance of the TFT, with reference to FIG. 3, the array substrate 01 further includes: light blocking layers 17 which is positioned between the base substrate 11 and the isolation layer 12 and correspond to the TFTs 13 in one-to-one correspondence, wherein the light blocking layers 17 at least correspond to a portion of the active layer 132, which is positioned on the inclined surface. That is, an orthogonal projection of the portion of the active layer 132, which is positioned on the inclined surface, on the base substrate 11 is overlapped with an orthogonal projection of the light blocking layer 17 on the base substrate 11, or the orthogonal projection of the portion of the active layer 132, which is positioned on the inclined surface, on the base substrate 11 is positioned within the orthogonal projection of the light blocking layer 17 on the base substrate 11.

Figure 5:
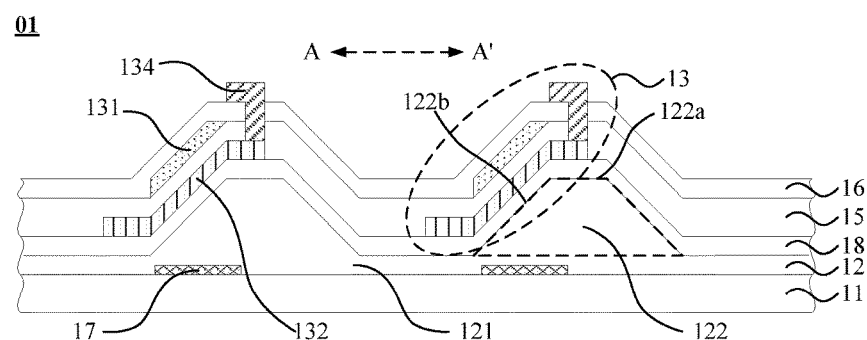
FIG. 5 is a sectional structural schematic diagram II of the portion A-A' in FIG. 2.

Further, as shown in FIG. 5, when both the main body layer 121 and the protrusion portion 122 are formed by the silicon nitride material, due to a high interface state density and a relatively large amount of surface dangling bonds of silicon nitride ($SiN_x$), if the LTPS active layer 132 is directly in contact with the isolation layer 12, electron mobility of the active layer may be easily affected; and thus, in this case, the array substrate 01 further includes: a silicon oxide insulating layer 18 positioned below the active layer 132 and covering the isolation layer 12. The silicon oxide ($SiO_2$)

material has a low interface state density and a small amount of surface dangling bonds, less influence on the electron mobility of the active layer 132, and can ensure an excellent switching characteristic of the LTPS TFT.

It should be noted herein that firstly, a thickness of the silicon oxide insulating layer 18 should meet a requirement that after the inclined surface of the protrusion portion 122 is covered, a region corresponding to the inclined surface 122b still can be kept being an inclined plane surface.

Exemplarily, when a distance from the top surface 122a of the protrusion portion 122 to a bottom surface of the main body layer 121 (i.e., a maximum thickness of the isolation layer 12) is 14 μm, the thickness of the silicon oxide insulating layer 18 is 100 nm. Because the thickness of the silicon oxide insulating layer 18 is much smaller than the maximum thickness of the isolation layer 12, the silicon oxide insulating layer 18 covering the isolation layer 12 still has a plane region and a convex region which respectively correspond to the portion of the main body layer 121 of the isolation layer 12 uncovered by the protrusion portion 122 and the protrusion portion 122.

Secondly, the silicon oxide insulating layer 18 covers the isolation layer 12, and thus, in this case, the pattern of the active layer 132 crosses the main body layer 121, the inclined surface and the top surface 122a, which means that the pattern of the active layer 132 crosses the respective regions of the silicon oxide insulating layer 18 covering the main body layer 121, the inclined surface and the top surface 122a of the isolation layer 12.

Further, the array substrate 01 further includes structures such as a pixel electrode, a common electrode and the like, and positions of the pixel electrode and the common electrode with respect to the TFT 13 can follow related art and are not repeated herein.

By taking a red, green, blue (RGB) sub pixels with a size of 21 μm*63 μm as an example below, a width of the non transmissive region occupied by the plane TFT is about 20 μm.

Figure 6:
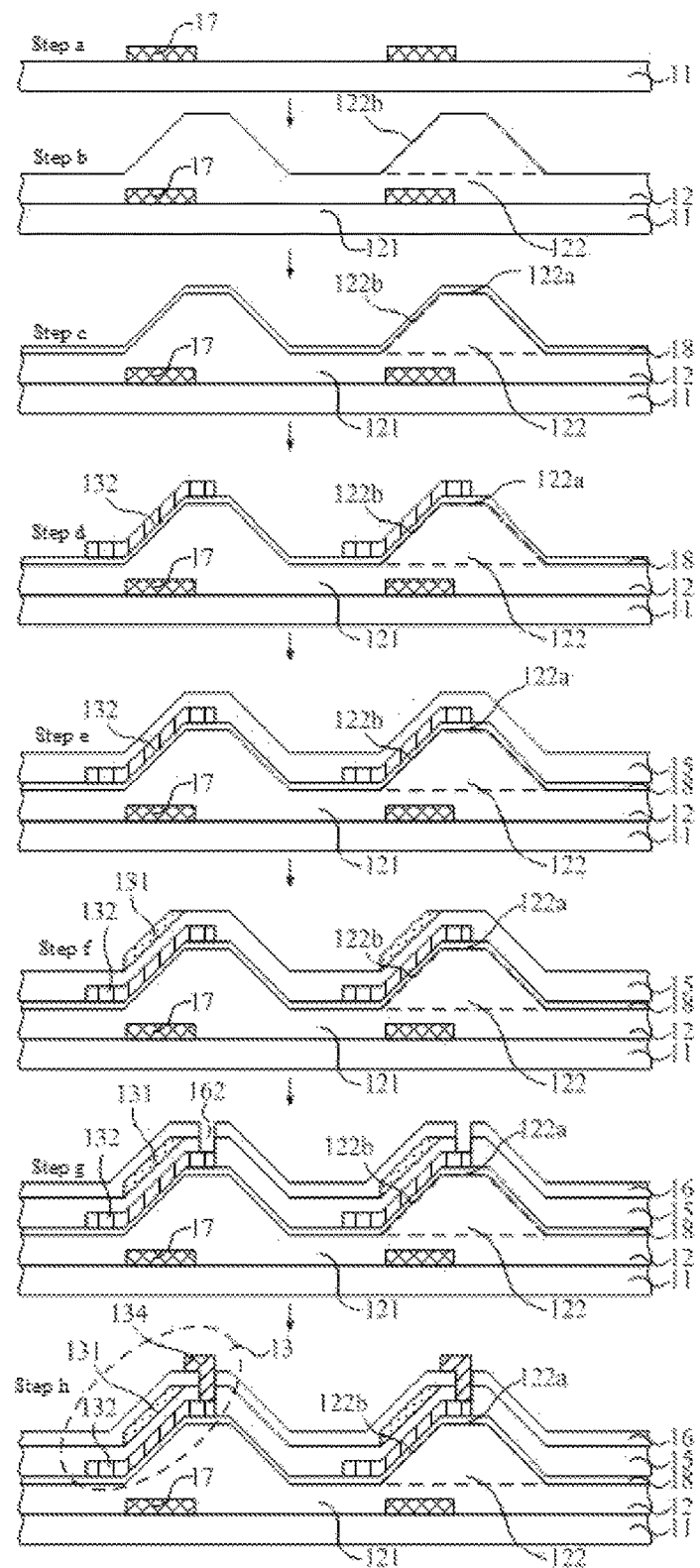
FIG. 6 is a schematic diagram of fabrication flow of a top-gate structural LTPS TFT array substrate provided by Embodiment 1 of the present disclosure.
Figure 7:
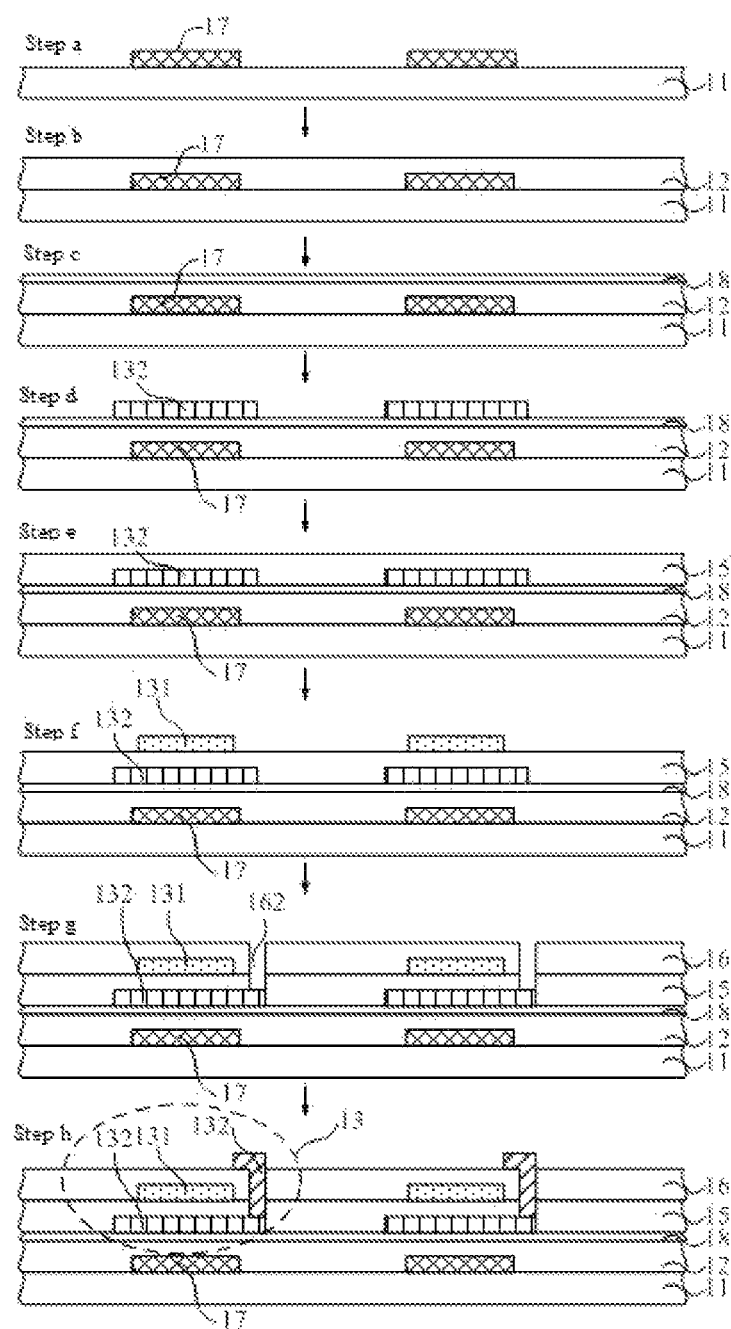
FIG. 7 is a schematic diagram of fabrication flow of a top-gate structural LTPS TFT array substrate provided in a related art corresponding to FIG. 6.

A schematic diagram of flow of a fabrication method of the array substrate 01 provided by Embodiment 1 is as shown in FIG. 6, and FIG. 7 is a schematic diagram of flow of a fabrication method of the plane TFT with the same graphic area.

With reference to FIG. 6, the process flow of the array substrate sequentially includes:

Step a: depositing a light blocking layer thin film on the base substrate 1, and forming the light blocking layer 17 corresponding to the TFT 13 to be formed by a patterning process.

Wherein, in the fabrication method described above and below, which is provided by the present disclosure, the patterning process may be any process to process a film layer (formed by one or more layers of thin films) to form a specific pattern. The typical patterning process is a process of performing photoresist exposure, development, etching and removal of photoresist by applying a mask. The mask may be a common mask, a halftone mask and a gray tone mask, and can be flexibly selected according to the corresponding patterning process.

Step b: depositing an isolation layer thin film covering the light blocking layer 17 on the base substrate 11, and carrying out a patterning process to form the isolation layer 12 formed by the main body layer 121 and the protrusion portion 122.

Wherein, the isolation layer thin film is formed by the SiN$_x$ material, and has a thickness of 14 μm; one lateral surface 122b of the protrusion portion 122 is configured to be the inclined surface for forming the subsequent TFT and gate line, and the included angle between the lateral surface 122b and the horizontal plane is 45°; and the lateral surface 122b of the protrusion portion 122 corresponds to the light blocking layer 17.

Step c: depositing the silicon oxide insulating layer 18 covering the isolation layer 12 and having a thickness of 100 nm.

Step d: depositing an active layer thin film covering the silicon oxide insulating layer 18, and carrying out a patterning process to form the active layer 12 crossing the main body layer 121, the inclined surface and the top surface 122a and having a U-shaped pattern.

Step e: depositing the gate insulating layer 15.

Step f: depositing a gate electrode thin film, and carrying out a patterning process to form the gate line 14.

Wherein, the gate line 14 is arranged on the inclined surface and a portion of the gate line 14 corresponding to the active layer 132, is the gate electrode 131.

Step g: depositing the inter layer dielectric layer (i.e., ILD layer) covering the gate line, and carrying out a patterning process to form the first through hole 161 and the second through hole 162 which pass through the inter layer dielectric layer 16 and the gate insulating layer 15.

Wherein, the first through hole 161 and the second through hole 162 are respectively exposed out of two ends of the U shape of the active layer 132.

Step h: depositing a source and drain metal thin film, and carrying out a patterning process to form the data line and the drain electrode 134.

Wherein, with reference to FIG. 4, a portion of the data line 23, which corresponds to one end of the U shape, is the source electrode; and the source electrode 133 and the drain electrode 134 are connected with the two ends of the U shape of the active layer 132 respectively through the first through hole 161 and the second through hole 162.

After the above steps are completed, steps of forming a planarization layer (i.e., an PLN layer or an acryl layer) covering the TFT 13, a common electrode (i.e., common Indium Tin Oxide (CITO)), a protective layer (i.e., a PVX layer) covering the common electrode and the pixel electrode (i.e., pixel Indium Tin Oxide (PITO)) can be sequentially carried out, which for example, can follow related art, and are not repeated herein.

It can be seen from comparison between FIG. 6 and FIG. 7 that when the graphic sizes of the active layer 132 and the gate line 14 respectively are the same with that of the plane TFT in the related art, the width of the non transmissive region occupied by the inclined surface TFT structure provided by the embodiment of the present disclosure is smaller than 20 μm in the related art, which is beneficial for further improving the aperture ratio of the array substrate 01.

Embodiment 2

Figure 8:
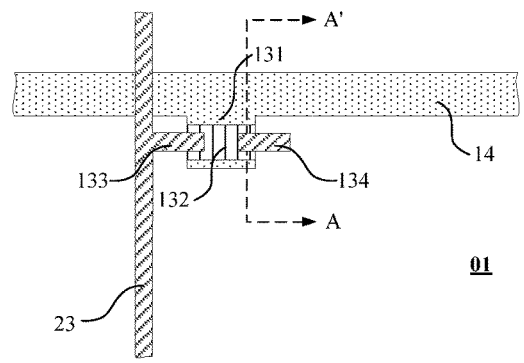
FIG. 8 is a top-view structural schematic diagram of one TFT in a bottom-gate structural a-Si TFT array substrate provided by Embodiment 2 of the present disclosure.
Figure 9:
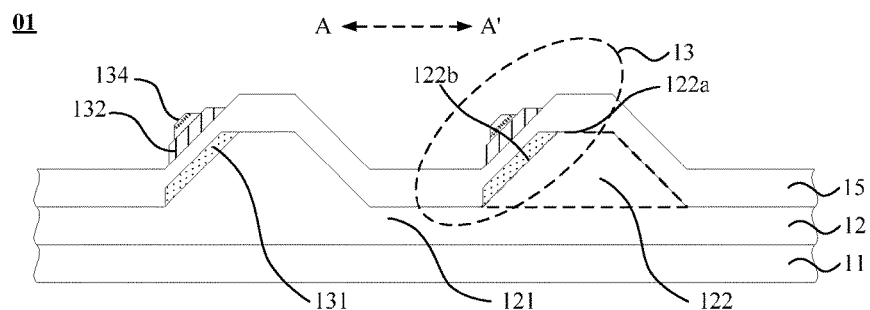
FIG. 9 is a sectional structural schematic diagram of a portion A-A' in FIG. 8.

As shown in FIG. 8 and FIG. 9, the protrusion portion 122 has a top surface 122a which is arranged between the two opposite lateral surfaces and is away from the main body layer 121; the array substrate 01 includes: a gate line 14 positioned on the lateral surface 122b of the protrusion portion 122 and connected with the gate electrode 131 of the TFT 13; a gate insulating layer 15 covering an isolation layer 12; an active layer 132 of an a-Si material positioned on the gate insulating layer 15 and opposite to the gate electrode 131; and a source electrode 133 directly in contact with the active layer 132, a drain electrode 134 and a data line 23 connected with the source electrode 133.

It should be noted that at least one of two lateral surfaces 122b of the protrusion portion 122, which extend along a gate line direction and are arranged oppositely, is an inclined surface arranged upwards with respect to the main body layer 121, and thus, the top surface 122a of the protrusion portion 122, which is away from the main body layer 121, for example, is smaller than a bottom surface close to the main body layer 121, i.e., the protrusion portion 122 is of a trapezoid structure.

FIG. 9 illustrates only by taking a case that one row of TFTs 13 arranged along the gate line direction and one gate line 14 are arranged on one lateral surface 122b of the protrusion portion 122, which extends along the gate line direction, as the example, and Embodiment 1 is also applicable to a case that one row of TFTs 13 arranged along the gate line direction and one gate line 14 are arranged on each of two lateral surfaces 122b of the protrusion portion 122, which extend along the gate line direction and are arranged oppositely.

The TFT in the array substrate 01 provided by Embodiment 2 is a bottom-gate structural a-Si TFT, wherein, the gate insulating layer 15 is generally made of the silicon nitride ($SiN_x$) material; if a top-gate type structure is adopted, i.e., an a-Si thin film is firstly prepared and then a silicon nitride thin film is prepared, it results in a high interface state density of the active layer and poor device performance; but if a bottom-gate type structure is adopted, i.e., the a-Si thin film is deposited on the silicon nitride thin film, an interface characteristic of the active layer can be improved, and electron mobility is higher, and thus, the current a-Si TFT generally is of the bottom-gate type structure.

Figure 10:
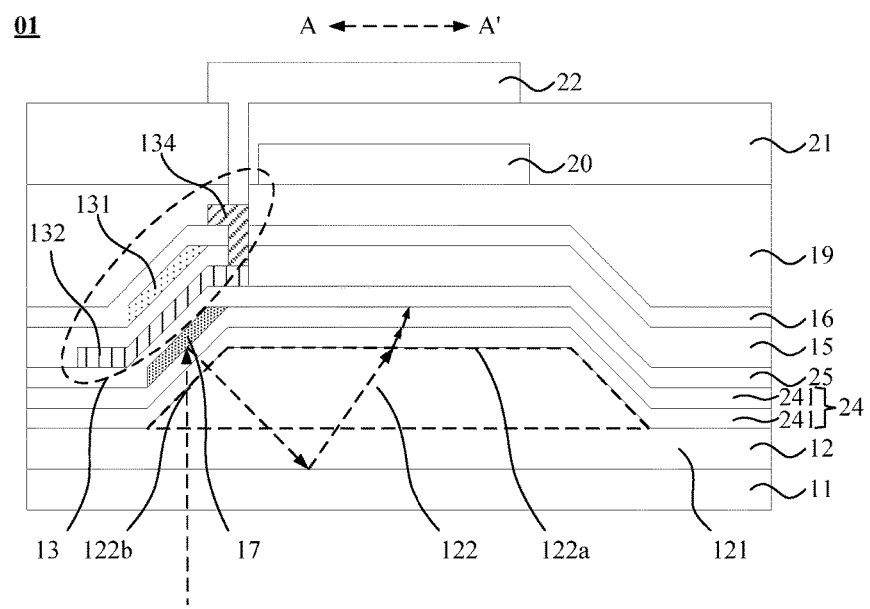
FIG. 10 is a schematic diagram of a light path in an array substrate provided by an embodiment of the present disclosure.

On this basis, the TFT is non transmissive, and light emitted by a backlight cannot transmit therethrough due to shielding of the TFT, so the light cannot be effectively utilized. Therefore, as shown in FIG. 10, the array substrate 01 further includes: an optical layer 24 positioned below the TFT 13 and covering the isolation layer 12, wherein refractive indexes of the base substrate 11, the isolation layer 12 and the optical layer 24 are sequentially increased.

In this way, the lateral surface 122b on which the TFT 13 is arranged is the inclined surface, and the top surface 122a of the protrusion portion 122 is smaller than the bottom surface 122c. Herein, the bottom surface 122c of the protrusion portion 122 can be virtual according to a cross section. For example, in a case that the protrusion portion 122 and the main body layer 121 of the isolation layer 12 are integrally formed, the bottom surface 122c of the protrusion portion 122 can be virtual. A first lateral surface 122b is a plane surface and an included angle between the first lateral surface 122b and the bottom surface 122c is an acute angle. The lateral surface 122b is inclined upwards. Due to a reflection effect of the metal gate electrode on the inclined surface, after the light in the backlight is incident onto the metal positioned on the inclined surface after passing through the back surface of the base substrate 11, the light will be reflected, and a reflection direction is far away from the inclined surface and close to a position below the top surface 122a. The refractive index of the isolation layer 12 is greater than that of the base substrate 11, and thus, the light will be totally reflected at the position of an interface of the isolation layer 12 and the base substrate 11. Further, the refractive index of the optical layer 24 is greater than that of the isolation layer 12 and meanwhile, is greater than that of the base substrate 11, and thus, when reaching an interface between the isolation layer 12 and the optical layer 24, the light totally reflected can be refracted to emerge from each layer above the top surface 122a of the protrusion portion 122. Due to arrangement of the pixel electrode in this region, by the metal reflection action and total reflection and refraction principles of the light, the light originally shielded by the TFT 13 can be emitted out from the region of the pixel electrode, so that a utilization rate of the array substrate for the backlight is improved, light transmittance of the array substrate is improved, and energy consumption of the backlight is reduced.

Herein, an included angle between the inclined surface and the horizontal plane can be controlled according to actual requirements, and for example, can be 10° to 80°, so that the light is reflected to a suitable angle after incident, and a size of the included angle can be controlled by manufacturing process parameters of different methods such as etching and the like.

A material of the base substrate 11 generally is a glass material with a low refractive index. Materials of the isolation layer 12 and the optical layer 24 can include, but are not limited to, at least one of the following materials: boron oxide ($B_2O_3$, with a refractive index of 1.63), borax ($Na_2B_4O_7 \cdot 10H_2O$, with a refractive index of 1.45 to 1.47), silicon oxide ($SiO_2$, with a refractive index of 1.45), silicon nitride ($SiN_x$, with a refractive index of 2.05), aluminium oxide ($Al_2O_3$, with a refractive index of 1.768), zinc oxide (ZnO, with a refractive index of 2.0), crystals (with a refractive index of 2.0), quartz (with a refractive index of 2.0), magnesium oxide (MgO, with a refractive index of 1.74), gallium oxide ($Ga_2O_3$, with a refractive index of 1.92), tin oxide ($SnO_2$, with a refractive index of 1.997), cadmium oxide (CdO, with a refractive index of 2.49), indium oxide (with a refractive index of 2.08), bismuth oxide ($Bi_2O_3$, with a refractive index of 1.9), nickel oxide (NiO, with a refractive index of 2.18), cadmium sulfide (CdS, with a refractive index of 2.35 to 2.53), calcium fluoride ($CaF_2$, with a refractive index of 1.436), copper oxide (CuO, with a refractive index of 2.7), ruby (with a refractive index of 1.77), sapphire (with a refractive index of 1.77), polypropylene (with a refractive index of 1.49), polyvinyl chloride (with a refractive index of 1.52 to 1.55), polystyrene (with a refractive index of 1.55), and polytetrafluoroethylene (Teflon, with a refractive index of 1.35) and resin (with a refractive index of 1.5 to 1.8).

Moreover, a position in an aperture region where the light emerges can be controlled by regulating thicknesses of the isolation layer 12 and the optical layer 24. Exemplarily, a value of the maximum thickness of the isolation layer 12, i.e., a distance from the top surface 122a of the protrusion portion 122 to the bottom surface of the main body layer 121, can be ranged from 30 nm to 90,000 nm; and a value of the thickness of the optical layer 24 can be ranged from 30 nm to 90,000 nm.

Further, in order to make a direction of the light emerging from the top surface 122a of the protrusion portion 122 more close to a vertical direction and improve emerging uniformity of the light, with reference to FIG. 10, the optical layer 24 can be formed by multiple transparent material layers 241, wherein along a direction away from the base substrate 11, refractive indexes of the respective transparent material layers 241 are sequentially increased so as to regulate the emerging direction of the light to be more close to the vertical direction.

Similarly, by regulating the thickness of the isolation layer 12 and thicknesses of the respective transparent material layers of the optical layer 24, the position in the open region, where the light emerges, can be controlled. Exemplarily, the value of the thickness of the isolation layer 12, i.e., the distance from the top surface 122a of the protrusion portion 122 to the bottom surface of the main body layer 121, can be ranged from 30 to 90,000 nm; and a value of the thickness of the respective transparent material layers of the optical layer 24 can be ranged from 30 to 90,000 nm.

One embodiment is provided below to illustrate the array substrate 01 with the optical layer 24 in detail.

Embodiment 3

With reference to FIG. 10, the protrusion portion 122 has a top surface 122a which is arranged between the two opposite lateral surfaces and is away from the main body layer 121. The array substrate 01 includes: a light blocking layer 17 positioned on the optical layer 24, a position of the light blocking layer 17 corresponding to a region of the optical layer 24 covering the inclined surface; a buffer layer 25 positioned above the optical layer 24; a gate insulating layer 15 isolating an active layer 132 of a TFT 13 from a gate electrode 131 of the TFT 13; and an inter layer dielectric layer 16 isolating a source electrode 133 of the TFT 13, a drain electrode 134 and the gate electrode 131 of the TFT 13, wherein a portion of a gate line 14 (not shown in the drawing) corresponding to the active layer 132 is the gate electrode 131; the active layer 132 is a U-shaped LTPS active layer, and a pattern of the active layer 132 crosses regions of the buffer layer 25 corresponding to the main body layer 121, the inclined surface and the top surface 122a, wherein each of two ends of the U shape of the active layer 132 is positioned in the region of the buffer layer 25 corresponding to the top surface 122a; the gate insulating layer 15 covers the active layer 132, and the gate line 14 is positioned in a region of the gate insulating layer 15 corresponding to the inclined surface; the inter layer dielectric layer 16 covers the gate line 14; and the source electrode 133 and the drain electrode 134 are connected with the two ends of the U shape active layer 132 respectively through a first through hole and a second through hole which pass through the inter layer dielectric layer 16 and the gate insulating layer 15.

Herein, at least one of the two lateral surfaces 122b of the protrusion portion 122, which extend along a gate line direction and are arranged oppositely, is the inclined surface arranged upwards with respect to the main body layer 121, and thus, the top surface 122a of the protrusion portion 122, which is away from the main body layer 121, for example, is smaller than a bottom surface close to the main body layer 121, i.e., the protrusion portion 122 is of a trapezoid structure.

The TFT 13 is a top-gate type LTPS TFT; and thus, in order to avoid a case that light in a backlight is irradiated to a channel region of the active layer 132 to generate a photogenic current to influence performance of the TFT, the light blocking layer 17 for blocking the light from being irradiating to the active layer 132 is arranged on the inclined surface. The light blocking layer 17 is positioned on the inclined surface, and the light blocking layer 17 is generally formed by a metal material and has relatively high reflectivity for the light; and thus, the light in the backlight can be reflected and emitted from the respective layers above the top surface 122a of the protrusion portion 122 by utilizing the total reflection and refraction principles so as to improve light transmittance of the array substrate 01.

On this basis, at least one of the buffer layer 25, the inter layer dielectric layer 16 and the gate insulating layer 15 is generally formed by the silicon oxide material with a low refractive index; and thus, in order to increase transmittance of the reflected light and avoid total reflection of the reflected light when entering into an optically thinner medium from an optically dense medium, the insulating layer with the low refractive index above the optical layer 24, which corresponds to a position above the top surface 122a of the protrusion portion 122, can be removed by carrying out a patterning process.

Figure 11:
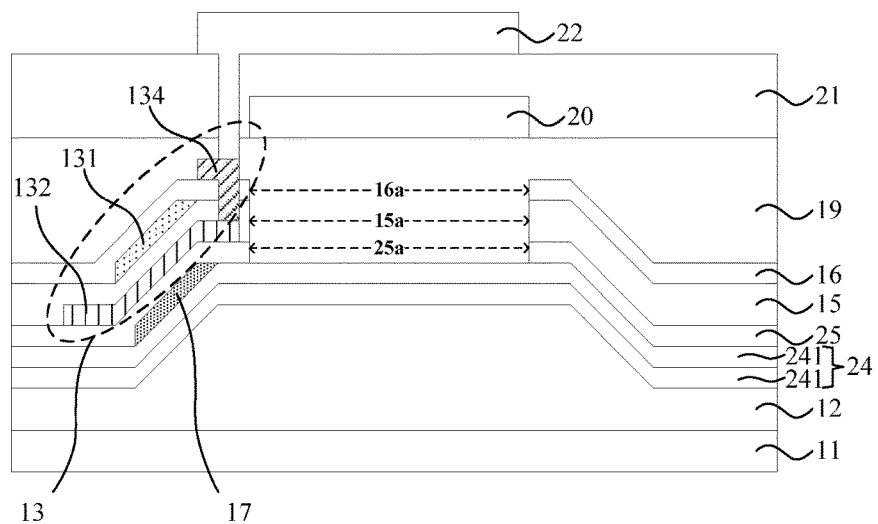
FIG. 11 is a sectional structural schematic diagram IV of the portion A-A' in FIG. 2.

As shown in FIG. 11, when a refractive index of the buffer layer 25 is smaller than that of the optical layer 24, at least part of the region of the buffer layer 25, which corresponds to the top surface 122a of the protrusion portion 122, is of a hollow-out structure (marked as 25a in the figure); and/or, when a refractive index of the gate insulating layer 15 is smaller than that of the optical layer 24, at least a part of the region of the gate insulating layer 15, which corresponds to the top surface 122a of the protrusion portion 122, is of a hollow-out structure (marked as 15a in the figure); and/or, when a refractive index of the inter layer dielectric layer 16 is smaller than that of the optical layer 24, at least a part of the region of the inter layer dielectric layer 16, which corresponds to the top surface 122a of the protrusion portion 122, is of a hollow-out structure (marked as 16a in the figure).

Herein, FIG. 11 illustrates only by taking a case that the buffer layer 25, the inter layer dielectric layer 26 and the gate insulating layer 15 are all formed by the silicon oxide material (with the refractive index of 1.45) and the optical layer 24 is formed by silicon nitride (with the refractive index of 2.05) as an example. When the refractive indexes of the buffer layer 25, the inter layer dielectric layer 16 and the gate insulating layer 15 are all smaller than that of the optical layer 24, regions of the hollow-out structure 25a of the buffer layer, the hollow-out structure 16a of the inter layer dielectric layer and the hollow-out structure 15a of the gate insulating layer correspond to each other to form a big through hollow-out structure, so that the hollow-out structure of each layer can be formed by carrying out fewer patterning processes, and an increase in process complexity degree is avoided.

Figure 12:
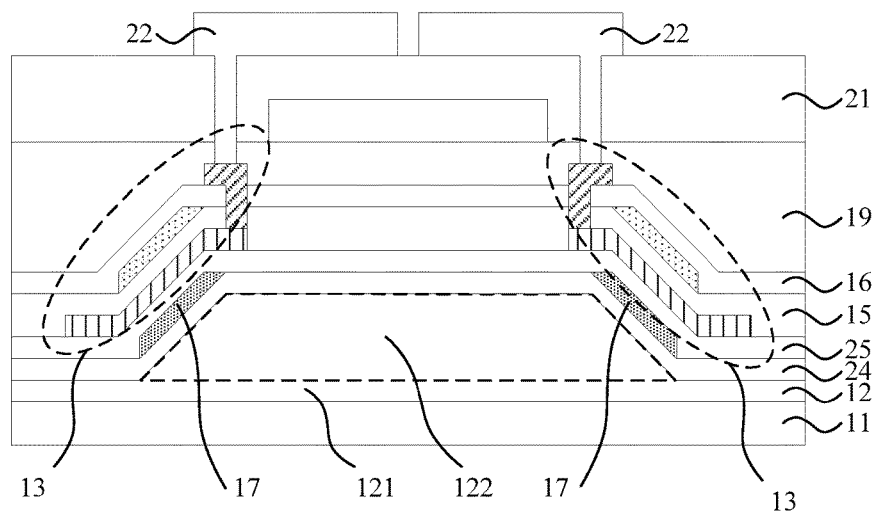
FIG. 12 is a sectional structural schematic diagram V of the portion A-A' in FIG. 2.

Further, the array substrate 01 further includes: a pixel electrode 22 connected with the drain electrode 134 of the TFT 13; and the pixel electrode 22 is positioned above the top surface 122a of the protrusion portion 122, wherein one row of TFTs 13 arranged along the gate line direction and one gate line 14 are provided on one lateral surface 122b of the protrusion portion 122, which extends along the gate line direction, with reference to FIG. 10, the pixel electrodes 22 corresponding to the one row of TFTs 13 are arranged above the top surface 22a of one protrusion portion 122, i.e., one row of pixel units are arranged; when one row of TFTs 13 arranged along the gate line direction and one gate line 14 are arranged on each of the two lateral surfaces 122b of the protrusion portion 122, which extend along the gate line direction, as shown in FIG. 12, the pixel electrodes 22 corresponding to the two adjacent rows of TFTs 13 are arranged above the top surface 122a of the one protrusion portion 122, i.e., two adjacent rows of pixel units are arranged.

Herein, the pixel electrode(s) 22 corresponding to one row or two adjacent rows of TFTs 13 are positioned on the protective layer 21 and corresponds to the top surface 122a of the protrusion portion 122; thus, the TFTs 13 and the gate line 14 can be arranged on one lateral surface 122b or two opposite lateral surfaces 122b of the protrusion portion 122 according to actual requirement, and a value of the width d (the position of d is shown in FIG. 2) of the top surface 122*a* of the protrusion portion 122 is controlled by the corresponding patterning process.

Further, the array substrate 01 can be an advanced super dimensional switching (ADS) type array substrate. With reference to FIG. 10 or FIG. 12, the array substrate 01 further includes: a planarization layer 19 covering the TFT 13; a common electrode 20 positioned in a region of the planarization layer 19, which corresponds to the top surface 122*a*; the protective layer 21 covering the common electrode 20 and the planarization layer 19; and the pixel electrode 22 positioned on the protective layer 21 and corresponding to the common electrode 20, wherein the pixel electrode 22 is connected with the drain electrode 134 through a third through hole passing through the protective layer 21 and the planarization layer 19.

Herein, with reference to FIG. 12, the pixel electrodes 22 corresponding to two adjacent rows of TFTs 13 are arranged above the top surface 122*a* of one protrusion portion 122, i.e., two adjacent rows of pixel units are arranged, the common electrodes 20 corresponding to the two adjacent rows of pixel units can be of an integral structure.

By taking RGB sub pixels with a size of 21 μm*63 μm as an example below, a width of an non transmissive region occupied by a plane TFT is about 20 μm.

Figure 13A:
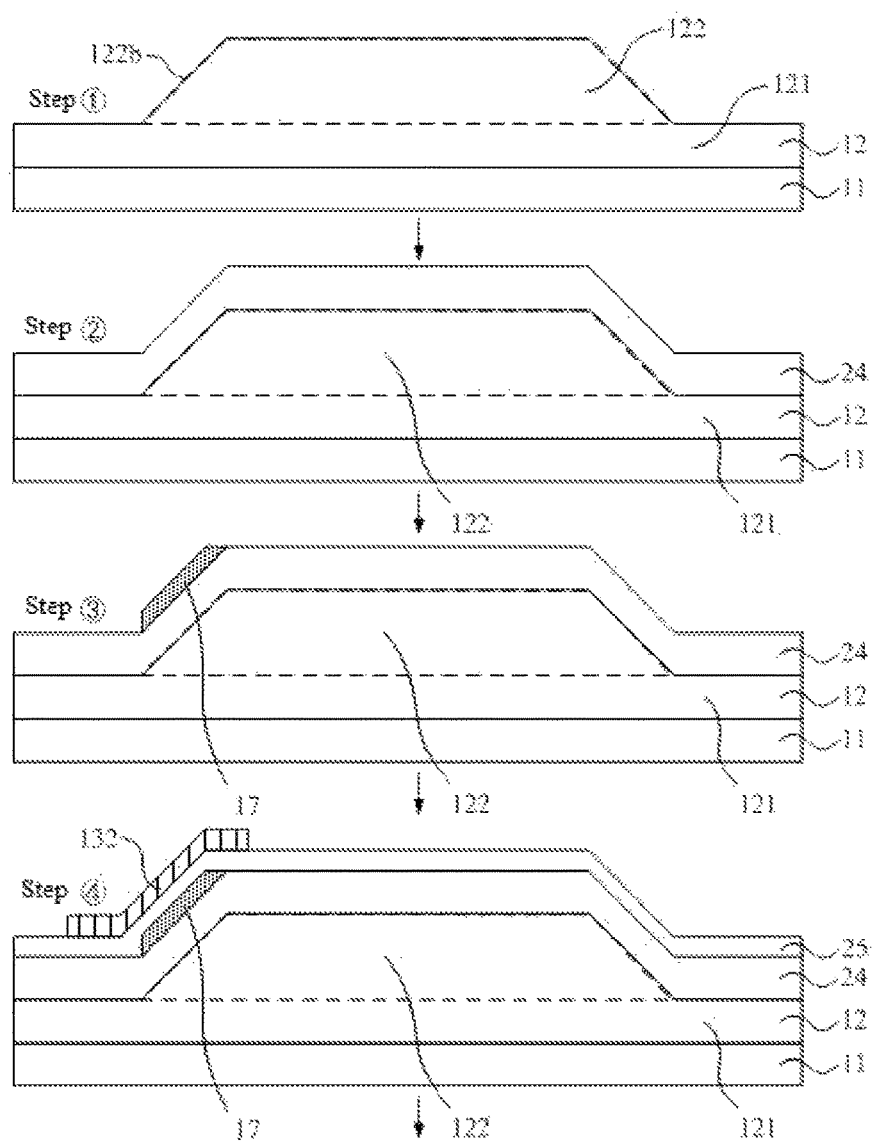
FIG. 13(a) is a schematic diagram of step ① to step ④ of fabrication flow of a top-gate structural LIPS TFT array substrate provided by Embodiment 3 of the present disclosure.
Figure 13B:
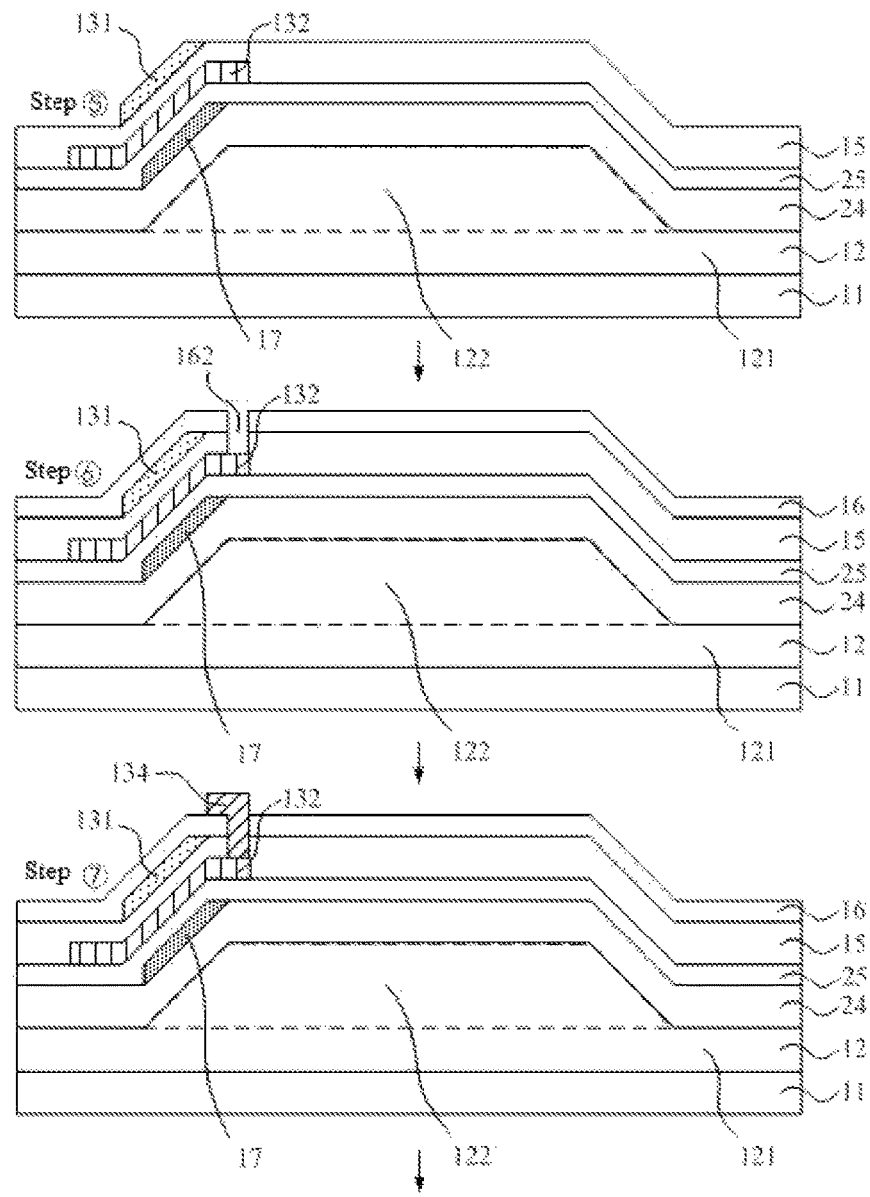
FIG. 13(b) is a schematic diagram of step ⑤ to step ⑦ of the fabrication flow of the top-gate structural LTPS TFT array substrate provided by Embodiment 3 of the present disclosure.
Figure 13C:
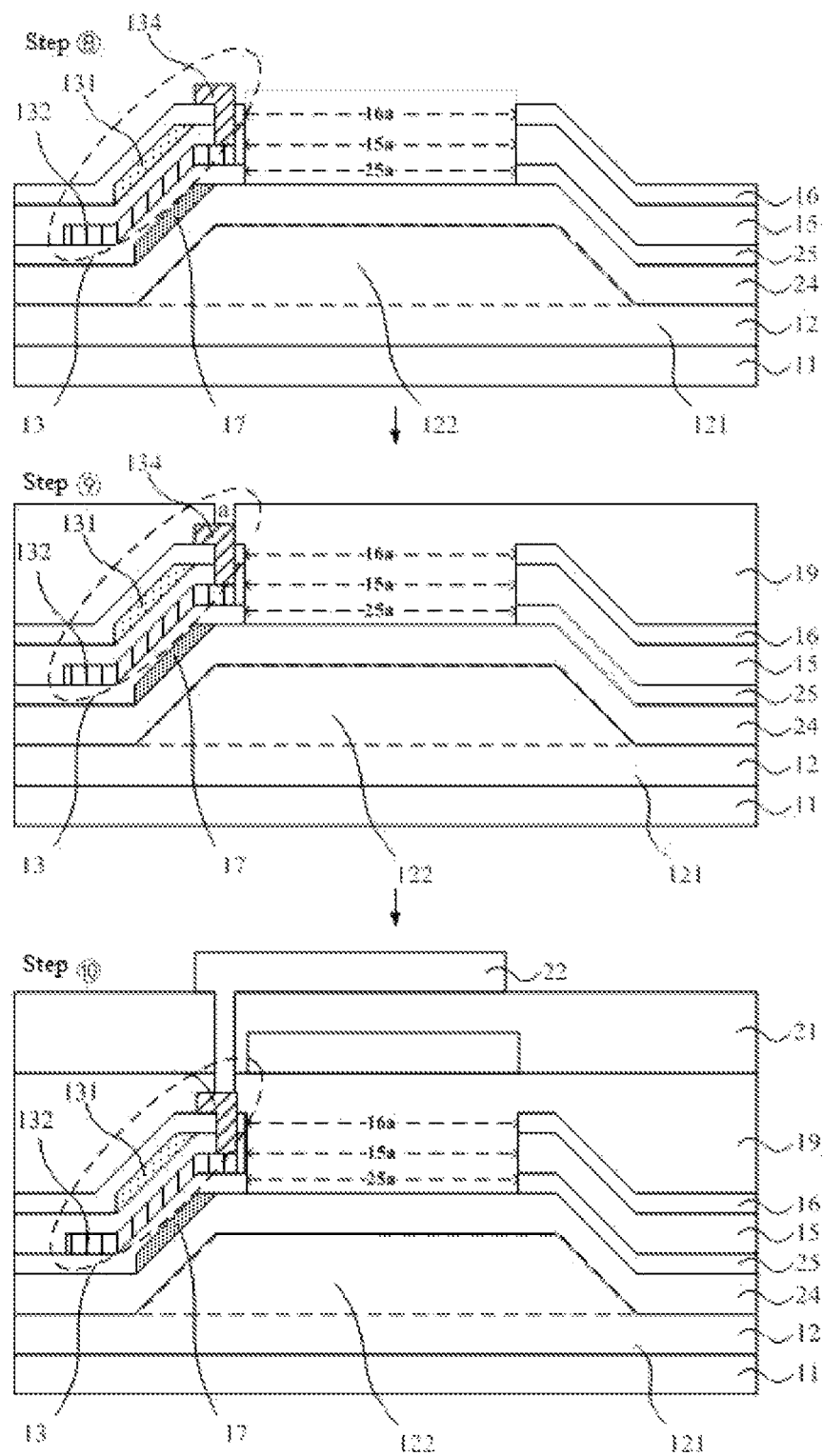
FIG. 13(c) is a schematic diagram of step ⑧ to step ⑩ of the fabrication flow of the top-gate structural LTPS TFT array substrate provided by Embodiment 3 of the present disclosure.

A schematic diagram of flow of a fabrication method of the array substrate 01 provided by Embodiment 3 is as shown in FIG. 13(*a*) to FIG. 13(*c*), and a schematic diagram of flow of a fabrication method of the plane TFT with the same graphic area can refer to FIG. 7, and is not repeated herein.

Fabrication steps below are illustrated only by taking a case that one row of TFTs 13 arranged along the gate line direction and one gate line 14 are provided on one lateral surface 122*b* of the protrusion portion 122, which extends along the gate line direction as an example. With reference to FIG. 13(*a*) to FIG. 13(*c*), the process flow sequentially includes:

Step ①: depositing an isolation layer thin film on a base substrate 11, and carrying out a patterning process to form an isolation layer 12 formed by the main body layer 121 and an array of the protrusion portions 122 matched with pixel periods.

Wherein, the base substrate 11 is formed by glass (with a refractive index of 1.5 to 1.7); the isolation layer thin film is formed by a MgO material (with a refractive index of 1.74), and has a thickness of 10 to 14 μm; and one lateral surface 122*b* of the protrusion portion 122 is configured to be an inclined surface with an included angle of 30° to 45° with respect to a horizontal plane.

Step ②: depositing the optical layer 24 on the isolation layer 12, the optical layer 24 being formed by a SiN$_x$ material (with a refractive index of 2.05).

In the top-gate structural LTPS TFT, the buffer layer positioned below the active layer is generally formed by a silicon nitride/silicon oxide double-layer structure, and thus, the optical layer 24 formed by SiN$_x$ can be used as a SiN$_x$ layer of the buffer layer below the active layer herein without carrying out an additional deposition.

Step ③: depositing a light blocking layer thin film on the optical layer 24, and carrying out a patterning process to form the light blocking layer 17 corresponding to the TFT 13 in a region of the optical layer 24, which corresponds to the inclined surface.

Herein, a pattern area of the light blocking layer 17 can be as large as possible so as to allow more backlight to be reflected.

Step ④: sequentially depositing the buffer layer 25 and an active layer thin film on the light blocking layer 17, and carrying out a patterning process to form the active layer 132 crossing the main body layer 121, the inclined surface and the top surface 122*a* and having a U-shaped pattern.

Wherein, the buffer layer 25 is formed by a SiO$_2$ (with a refractive index of 1.45) material; and the active layer thin film is formed by an LTPS material.

Step ⑤: sequentially depositing the gate insulating layer 15 and a gate electrode thin film on the buffer layer 25 and the active layer 132, and carrying out a patterning process to form the gate line 14.

Wherein, the gate insulating layer is formed by SiO$_2$ (with a refractive index of 1.45) material: and a portion of the gate line 14, which is arranged on the inclined surface and corresponds to the active layer 132, is the gate electrode 131.

Step ⑥: depositing the inter layer dielectric layer 16 on the gate insulating layer 15 and the gate line 14, and forming a first through hole 161 and a second through hole 162 which respectively pass through the inter layer dielectric layer 16 and the gate insulating layer 15 by a patterning process so as to expose two ends of the U shape the active layer 132.

Herein, the inter layer dielectric layer 16 is formed by SiO$_2$ (with a refractive index of 1.45) material.

Step ⑦: depositing a source and drain metal thin film on the inter layer dielectric layer 16, and carrying out a patterning process to form a data line and the drain electrode 134.

Herein, a portion of the data line, which corresponds to one end of the U shape, is the source electrode; and the source electrode 133 and the drain electrode 134 are connected with the two ends of the U shape the active layer 132 respectively through the first through hole 161 and the second through hole 162.

Step ⑧: by carrying out a patterning process, forming the hollow-out structure (marked as 15*a* in the figure) in a part of region of the gate insulating layer 15, which corresponds to the top surface 122*a* of the protrusion portion 122, forming the hollow-out structure (marked as 25*a* in the figure) in a part of region of the buffer layer 25, which corresponds to the top surface 122*a* of the protrusion portion 122, and forming the hollow-out structure (marked as 16*a* in the figure) in a part of region of the inter layer dielectric layer 16, which corresponds to the top surface 122*a* of the protrusion portion 122.

Wherein, the hollow-out structures of all the film layers are of an integral structure. Herein, the hollow-out structures are formed in order to remove the SiO$_2$ layer with the low refractive index in the multilayer structure material to increase light transmittance of the reflected light and avoid total reflection of the light when the light enters the optically thinner medium from the optically dense medium; and thus, the gate insulating layer 15, the buffer layer 25 and the inter layer dielectric layer 16 which are deposited in a pixel aperture region on the horizontal plane on the top of the trapezoid are subjected to etching process.

Step ⑨: depositing the planarization layer 19 on the multilayer structure, and forming a via hole (marked as a in the figure) by a patterning process to expose the drain electrode 134.

Step ⑩: depositing a common electrode thin film on the planarization layer 19 and carrying out a patterning process to form the common electrode 20 in a region of the planarization layer 19, which corresponds to the top surface 122*a*; depositing the protective layer 21 on the planarization layer 19 and the common electrode 20, and carrying out a patterning process to form a via hole exposing the drain electrode 134; and depositing a pixel electrode thin film on the protective layer 21, and carrying out a patterning process to form the pixel electrode 22 in a region on the protective layer 21, which corresponds to the common electrode 20.

Wherein, the via hole in the planarization layer 19 is communicated with the via hole in the protective layer 1 to form a third through hole exposing the drain electrode 134, and the pixel electrode 22 is connected with the drain electrode 134 through the third through hole.

On this basis, an embodiment of the present disclosure further provides a display panel, including the array substrate. The display panel, for example, can be applied to any product or part with a display function, e.g., a liquid crystal display, a liquid crystal television, an Organic Light-Emitting Display (OLED) display, an OLED television, electronic paper, a digital photo frame, a mobile phone, a tablet personal computer, a digital photo frame and the like.

It should be noted that all the drawings in the embodiments of the present disclosure are brief schematic diagrams of the array substrate, are just intended to clearly describe the solution and show structures related to invention points, and other structures unrelated to the invention points are existing structures and are not shown or are only partially shown in the drawings.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of the Chinese Patent Application No. 201610016962.5 filed on Jan. 11, 2016, the disclosure of which are incorporated herein by its reference in its entirety as part of the present application.

The invention claimed is:

1. An array substrate, comprising:
  a base substrate, with a main surface;
  an isolation layer on the main surface of the base substrate;
  a first thin film transistor on the isolation layer and a first gate line extending in a gate line direction,
  a second thin film transistor on the isolation layer and a second gate line extending in the gate line direction, and
  an optical layer positioned between the first thin film transistor, the second thin film transistor and the isolation layer,
  wherein, the first thin film transistor includes a first gate electrode, a first active layer, a first source electrode and a first drain electrode,
  the isolation layer includes a protrusion portion which extends in the gate line direction and protrudes upwards with respect to the base substrate, the protrusion portion has a first lateral surface and a second lateral surface which extend along the gate line direction, the first lateral surface and the second lateral surface are arranged oppositely, and each of orthogonal projections of the first active layer and the first gate electrode of the first thin film transistor on the main surface of the base substrate is overlapped with an orthogonal projection of the first lateral surface of the protrusion portion on the main surface of the base substrate,
  wherein the second thin film transistor includes a second gate electrode, a second active layer, a second source electrode and a second drain electrode; and each of orthogonal projections of the second active layer and the second gate electrode of the second thin film transistor on the main surface of the base substrate is overlapped with an orthogonal projection of the second lateral surface of the protrusion portion on the main surface of the base substrate,
  wherein the orthogonal projections of the first gate electrode, the first active layer, the first source electrode and the first drain electrode of the first thin film transistor on the main surface of the base substrate, the orthogonal projections of the second gate electrode, the second active layer, the second source electrode and the second drain electrode of the second thin film transistor on the main surface of the base substrate, and the orthogonal projection of the protrusion portion on the main surface of the base substrate are entirely within an orthogonal projection of the optical layer on the main surface of the base substrate, and refractive indexes of the base substrate, the isolation layer and the optical layer are sequentially increased.

2. The array substrate according to claim 1, wherein the protrusion portion further includes a bottom surface located between the first lateral surface and the second lateral surface and facing to the base substrate, the first lateral surface of the protrusion portion is a plane surface, and an included angle between the first lateral surface and the bottom surface is an acute angle.

3. The array substrate according to claim 1, wherein the isolation layer further includes a main body layer located between the protrusion portion and the base substrate and having a uniform thickness.

4. The array substrate according to claim 1, wherein the orthogonal projection of the first gate electrode of the first thin film transistor on the main surface of the base substrate is entirely within the orthogonal projection of the first lateral surface of the protrusion portion on the main surface of the base substrate.

5. The array substrate according to claim 4, wherein the protrusion portion has a top surface arranged between the first lateral surface and the second lateral surface and away from the main body layer; and
  the array substrate further includes:
    a light blocking layer on the optical layer, wherein an orthogonal projection of a portion of the first active layer located above the first lateral surface on the main surface of the base substrate is entirely within an orthogonal projection of the light blocking layer on the main surface of the base substrate;
    a buffer layer above the light blocking layer;
    a gate insulating layer isolating the first active layer of the first thin film transistor from the first gate electrode of the first thin film transistor; and
    an inter layer dielectric layer isolating the first source electrode and the first drain electrode of the first thin film transistor from the first gate electrode of the first thin film transistor,
  wherein, in a direction perpendicular to the base substrate, a portion of the first gate line opposite to the first active layer is the first gate electrode of the first thin film transistor;
  the first active layer is a U-shaped low temperature poly silicon active layer; the orthogonal projection of the first active layer on the main surface of the base substrate includes a first portion overlapped with the orthogonal projection of the first lateral surface of the protrusion portion on the main surface of the base substrate, a second portion overlapped with a orthogonal projection of the top surface of the protrusion portion on the main surface of the base substrate, and a third portion outside the orthogonal projection of the protrusion portion on the main surface of the base substrate, wherein each of two ends of the active layer is located right above the top surface;

the active layer is covered by the gate insulating layer, an orthogonal projection of the first gate line on the main surface of the base substrate is overlapped with the orthogonal projection of the first lateral surface of the protrusion portion on the main surface of the base substrate;

the first gate line is covered by the inter layer dielectric layer, the first source electrode and the first drain electrode are connected with the two ends of the first active layer respectively through a first through hole and a second through hole which pass through the inter layer dielectric layer and the gate insulating layer.

6. The array substrate according to claim 5, wherein a refractive index of the buffer layer is smaller than that of the optical layer, and a portion of the buffer layer located right above the top surface of the protrusion portion includes a first hollow-out structure;

and/or, a refractive index of the gate insulating layer is smaller than that of the optical layer, and a portion of the gate insulating layer located right above the top surface of the protrusion portion includes a second hollow-out structure;

and/or, a refractive index of the inter layer dielectric layer is smaller than that of the optical layer, and a portion of the inter layer dielectric layer located right above the top surface of the protrusion portion includes a third hollow-out structure.

7. The array substrate according to claim 6, wherein the refractive indexes of the buffer layer, the gate insulating layer and the inter layer dielectric layer are all smaller than that of the optical layer; and the first hollow-out structure of the buffer layer, the second hollow-out structure of the gate insulating layer and the third hollow-out structure of the inter layer dielectric layer are communicated with each other.

8. The array substrate according to claim 1, wherein the second lateral surface of the protrusion portion is a plane surface and an included angle between the second lateral surface and the main surface of the base substrate is an acute angle.

9. The array substrate according to claim 1, wherein the optical layer is formed by a plurality of transparent material layers; and along a direction perpendicular to the main surface of the base substrate and away from the base substrate, refractive index of the respective transparent material layers are sequentially increased.

10. The array substrate according to claim 1, wherein the protrusion portion further has a top surface arranged between the first lateral surface and the second lateral surface and away from the main body layer.

11. The array substrate according to claim 10, further comprising:

a gate insulating layer isolating the first active layer of the first thin film transistor from the first gate electrode of the first thin film transistor; and an inter layer dielectric layer isolating the first source electrode and the first drain electrode of the first thin film transistor from the first gate electrode, wherein, in a direction perpendicular to the base substrate, a portion of the first gate line, opposite to the first active layer is the first gate electrode of the first thin film transistor;

the first active layer is a U-shaped low temperature poly silicon active layer; the orthogonal projection of the first active layer on the main surface of the base substrate includes a first portion overlapped with the orthogonal projection of the first lateral surface of the protrusion portion on the main surface of the base substrate, a second portion overlapped with a orthogonal projection of the top surface of the protrusion portion on the main surface of the base substrate, and a third portion outside the orthogonal projection of the protrusion portion on the main surface of the base substrate, wherein, each of two ends of the active layer positioned right above the top surface;

the active layer is covered by the gate insulating layer, an orthogonal projection of the first gate line on the main surface of the base substrate is overlapped with the orthogonal projection of the first lateral surface of the protrusion portion on the main surface of the base substrate;

the first gate line is covered by the inter layer dielectric layer; the first source electrode and the first drain electrode are connected with the two ends of the first active layer respectively through a first through hole and a second through hole which pass through the inter layer dielectric layer and the gate insulating layer.

12. The array substrate according to claim 11, further comprising: a light blocking layer positioned between the base substrate and the isolation layer, wherein an orthogonal projection of a portion of the first active layer located above the first lateral surface on the main surface of the base substrate is entirely within an orthogonal projection of the light blocking layer on the main surface of the base substrate.

13. The array substrate according to claim 10, comprising: a first pixel electrode connected with the first drain electrode of the first thin film transistor, the first pixel electrode being located right above the top surface of the protrusion portion.

14. The array substrate according to claim 10, further comprising:

a planarization layer covering the first thin film transistor;

a common electrode located on the planarization layer and right above the top surface of the protrusion portion;

a protective layer covering the common electrode and the planarization layer; and a first pixel electrode located on the protective layer and corresponding to the common electrode, wherein, the first pixel electrode is connected with the first drain electrode through a third through hole passing through the protective layer and the planarization layer.

15. The array substrate according to claim 1, wherein the isolation layer is formed by a silicon nitride material; and the array substrate further includes: a silicon oxide insulating layer below the first active layer and covering the isolation layer.

16. A display panel, comprising the array substrate according to claim 1.

17. A fabrication method of an array substrate, comprising:

forming an isolation layer on a main surface of the base substrate, the isolation layer including: a protrusion portion which extends in a gate line direction and protrudes upwards with respect to the base substrate, wherein the protrusion portion has a first lateral surface and a second lateral surface which extend along the gate line direction, and the first lateral surface and the second lateral surface are arranged oppositely; and forming a first gate electrode, a first active layer, a first source electrode and a first drain electrode of a first thin film transistor on the first lateral surface of the protrusion portion, forming a second gate electrode, a second active layer, a second source electrode and a second drain electrode of a second thin film transistor on the second lateral surface of the protrusion portion, wherein each of orthogonal projections of the first active layer and the first gate electrode of the first thin film transistor on the main surface of the base substrate is overlapped with an orthogonal projection of the first lateral surface of the protrusion portion on the main surface of the base substrate, each of orthogonal projections of the second active layer and the second gate electrode of the second thin film transistor on the main surface of the base substrate is overlapped with an orthogonal projection of the second lateral surface of the protrusion portion on the main surface of the base substrate, and providing an optical layer positioned between the first thin film transistor, the second thin film transistor and the isolation layer, wherein the orthogonal projections of the first gate electrode, the first active layer, the first source electrode and the first drain electrode of the first thin film transistor on the main surface of the base substrate, the orthogonal projections of the second gate electrode, the second active layer, the second source electrode and the second drain electrode of the second thin film transistor on the main surface of the base substrate, and the orthogonal projection of the protrusion portion on the main surface of the base substrate are entirely within an orthogonal projection of the optical layer on the main surface of the base substrate, and refractive indexes of the base substrate, the isolation layer and the optical layer are sequentially increased.

* * * * *